US012716959B2

(12) United States Patent
Allias et al.

(10) Patent No.: US 12,716,959 B2
(45) Date of Patent: Aug. 25, 2026

(54) SYSTEM FOR PROTECTING AN ELECTRICAL CIRCUIT FOR AN AIRCRAFT

(71) Applicant: Airbus Operations SAS, Toulouse (FR)

(72) Inventors: Jean-François Allias, Toulouse (FR); Florian Carpentier, Blagnac (FR)

(73) Assignee: Airbus Operations SAS, Toulouse (FR)

( * ) Notice: Subject to any disclaimer, the term of this patent is extended or adjusted under 35 U.S.C. 154(b) by 204 days.

(21) Appl. No.: 18/620,052

(22) Filed: Mar. 28, 2024

(65) Prior Publication Data

US 2024/0329154 A1 Oct. 3, 2024

(30) Foreign Application Priority Data

Mar. 31, 2023 (FR) ........................................ 2303146

(51) Int. Cl.

| | |
|---|---|
| ***G01R 31/52*** | (2020.01) |
| ***G01R 27/18*** | (2006.01) |
| ***G01R 31/54*** | (2020.01) |
| ***H02H 3/16*** | (2006.01) |

(52) U.S. Cl.

CPC ............. *G01R 31/52* (2020.01); *G01R 27/18* (2013.01); *G01R 31/54* (2020.01); *H02H 3/167* (2013.01)

(58) Field of Classification Search

CPC ........ G01R 31/52; G01R 31/54; G01R 27/18; H02H 3/167

See application file for complete search history.

(56) References Cited

U.S. PATENT DOCUMENTS

| | | | | |
|---|---|---|---|---|
| 2010/0217546 | A1* | 8/2010 | Locker | G01R 29/16 702/58 |
| 2014/0195097 | A1* | 7/2014 | Yamanaka | B60L 50/16 180/65.21 |
| 2015/0103447 | A1* | 4/2015 | Brouwer | H02H 7/00 361/1 |
| 2015/0311697 | A1 | 10/2015 | Faxvog et al. | |
| 2018/0348280 | A1 | 12/2018 | Collins et al. | |
| 2018/0372790 | A1* | 12/2018 | James | G01R 31/14 |
| 2020/0017235 | A1* | 1/2020 | Compton | H02J 4/00 |
| 2022/0014011 | A1* | 1/2022 | Smith | H02H 5/00 |

FOREIGN PATENT DOCUMENTS

WO 2014197942 A1 12/2014

OTHER PUBLICATIONS

French Search Report for corresponding French Patent Application No. 2303146 dated Nov. 28, 2023.

* cited by examiner

*Primary Examiner* — Stephanie E Bloss
*Assistant Examiner* — Michael A Harrison
(74) *Attorney, Agent, or Firm* — Greer, Burns & Crain, Ltd.

(57) ABSTRACT

An electrical protection system for protecting an electrical circuit comprising a generator and a plurality of electrical apparatuses, each apparatus comprising a chassis. The protection system comprises a first link associated with each apparatus, connecting the chassis of the apparatus to an earth, and comprising a protection resistor. For at least one electrical apparatus operating under direct current, the associated first electrical link comprises a protection capacitor in parallel with the protection resistor. The protection system comprises a second link connecting a neutral point of the generator to the earth.

13 Claims, 4 Drawing Sheets

SYSTEM FOR PROTECTING AN ELECTRICAL CIRCUIT FOR AN AIRCRAFT

CROSS-REFERENCES TO RELATED APPLICATIONS

This application claims the benefit of French Patent Application No. 2303146 filed on Mar. 31, 2023, the entire disclosure of which is incorporated herein by way of reference.

FIELD OF THE INVENTION

The present invention relates to the field of protection of electrical installations and more particularly relates to a protection system for protecting an electrical circuit of an aircraft.

BACKGROUND

An electrical installation presents a risk to hardware and continuity of service when part of the installation that is not intended to be live (powered) and that is potentially conductive comes into contact with a non-zero electrical potential. This is called an insulation fault. In order to prevent such a risk, earthing systems, also known as grounding systems, define how to connect, on the one hand, a neutral point of an electrical power source, and on the other hand, any chassis of an electrical apparatus of the electrical installation, or in other words any potentially conductive part that is not intended to be live, to a reference potential such as an earth.

In the so-called IT earthing system, the neutral point of the power source is connected to earth through a high impedance, i.e., by means of an impedance or resistance, and the chassis of each electrical apparatus is connected to earth. The IT earthing system allows one insulation fault in an electrical circuit to be tolerated. When a non-zero voltage resulting from the insulation fault develops between a terminal of the power source and the neutral point of the power source, this generates a fault current that is relatively low because inversely proportional to the resistance between the neutral point of the power source and earth. The fault current is thus tolerable by the electrical circuit and hardware.

In contrast, the IT earthing system does not allow more than one insulation fault in the electrical circuit to be tolerated. When a second insulation fault occurs, the fault current becomes high because it flows through the lowest impedance path and therefore no longer passes through the neutral point of the power source and the resistance but through each of the two insulation faults, thus creating a short-circuit.

An insulation monitoring device (IMD) may be used to detect insulation faults as soon as they occur, for example by comparing a fault current to a detection threshold, this thus allowing action to be taken to repair a first insulation fault before a second insulation fault occurs. Furthermore, the insulation monitoring device is used in conjunction with a safety device such as a fuse, so that the insulation monitoring device may trigger the safety device as soon as a second fault occurs and stop the supply of power to the electrical circuit, this protecting hardware but degrading continuity of service.

It will be noted that, in the present description, the term "capacitance" has sometimes been used to designate a "capacitor". In other words, for the sake of simplicity, the term "capacitor", which designates a component, and the term "capacitance", which designates the electrical capacitance that characterizes such a component, have been used interchangeably.

However, the presence of certain capacitances (i.e. capacitors) in the electrical circuit, and in particular of unavoidable capacitances such as common-mode capacitances or parasitic capacitances, may cause alternating signals to pass through earth and then trigger detection of an insulation fault by the insulation monitoring device, even in the absence of such an insulation fault. The diagnosis is then erroneous and may result in the safety device being triggered and supply of power to the electrical circuit being stopped, even when the actual number of insulation faults is lower than two and does not require it. Moreover, the detection threshold may be difficult to determine because the currents generated by the parasitic capacitances may vary, in particular when the power delivered by the power source varies.

Furthermore, the presence in the electrical circuit of capacitances may prevent the IT earthing system from tolerating a single insulation fault. This is for example the case when an electrical circuit comprises electrical apparatuses operating under direct current and electrical apparatuses operating under alternating current. An insulation fault on an apparatus operating under alternating current causes an alternating signal to be injected through earth. Such an alternating signal is therefore transmitted to a capacitance connecting one of the terminals of the power source to a chassis of another electrical apparatus. When the voltage level of the alternating signal is high, the capacitance may not be able to handle the alternating voltage and is then destroyed. When the voltage level is lower, the capacitance in question allows an alternating component to pass, which component may then be delivered to part of the electrical circuit operating under direct current, causing destruction of electrical apparatuses or hardware present in said part of the electrical circuit.

However, such capacitances may be unavoidable or necessary. For example, certain parasitic capacitances result from the configuration of the electrical circuit and are unavoidable. Such parasitic capacitances are formed by an interaction, through an insulator, between two conductors positioned in parallel, such as a conductor wire of a cable, another wire of the same cable, a shield of the cable or even an equipotential conductor used as earth. Furthermore, the effects of parasitic capacitances increase as the power delivered by the electrical circuit increases. According to another example, certain filtering capacitors are necessary because they allow AC components at defined frequencies to be filtered, with a view to earthing them in order to limit the noise in an electrical signal and thus increase the lifespan of electrical components through which said signal passes.

In the context of an electrical circuit of an aircraft, it is necessary to be able to tolerate at least one insulation fault in an electrical circuit in order to maintain the supply of power even when an insulation fault occurs, particularly in the case of electrically powered propulsion motors. This is especially true as certain functions required to generate electricity using fuel-cell stacks, such as cooling functions or functions allowing dihydrogen or dioxygen to be delivered, are shared by a number of electric motors.

In addition, an electrical circuit of an aircraft is generally not visible or easily accessible to diagnose the presence of insulation faults and perform maintenance.

It would thus be desirable to mitigate these drawbacks of the prior art.

It would in particular be desirable to provide a solution allowing at least one insulation fault to be tolerated, even when capacitances, irrespectively of whether they are unavoidable or necessary, are present in the electrical circuit. It would also be desirable to provide a solution allowing a plurality of insulation faults to be tolerated. Lastly, it would be desirable to provide a solution allowing the presence and location of insulation faults to be easily detected, remotely.

SUMMARY OF THE INVENTION

One object of the present invention is to provide an electrical protection system for protecting an electrical circuit of an aircraft. The electrical circuit comprises: a generator and a plurality of electrical apparatuses, each electrical apparatus comprising a chassis. The electrical protection system comprises: a first electrical link associated with each electrical apparatus, each first electrical link connecting the chassis of said electrical apparatus to an earth, each first electrical link comprising a resistor, called the protection resistor, and a second electrical link connecting a neutral point of the generator to the earth. Furthermore, for at least one electrical apparatus operating under direct current, the associated first electrical link comprises a capacitor, called the protection capacitor, in parallel with the protection resistor.

Thus, the electrical protection system allows one or more insulation faults in the electrical circuit to be tolerated, even when parasitic capacitances or filtering capacitors are present in the electrical circuit. In other words, the electrical protection system allows continuity of operation of the electrical circuit in the event of an insulation fault. For the at least one electrical apparatus operating under direct current, the fact that the first electrical link (which connects the chassis of the electrical apparatus to earth) comprises a protection capacitor in parallel with a protection resistor allows, in the event of an insulation fault:

- the protection resistor to pass to earth the direct component of a fault current, this prevents this direct component from degrading the electrical load of the electrical apparatus and guarantees human safety; furthermore, the protection resistor allows the fault current to be limited, this allowing the current in the cables supplying the electrical load to be limited and therefore preventing damage thereof and allowing continuity of operation of the electrical apparatus; and
- the protection capacitor to let pass to earth the one or more alternating components of the current (these alternating components, also called "harmonic currents" or simply "harmonics", correspond to common-mode currents (alternating currents generated inter alia by inverters switching, noises radiated by other loads and picked up via an antenna effect, etc.)), this preventing these one or more alternating components from degrading the electrical load of the electrical apparatus operating under direct current.

According to one particular embodiment, for at least one electrical apparatus operating under alternating current, the associated first electrical link comprises only the protection resistor, and no protection capacitor in parallel.

According to one particular embodiment, the electrical circuit further comprises at least one shielded cable comprising a shield and connecting at least one electrical apparatus to the terminals of the generator. The electrical protection system further comprises a first electrical link associated with each shielded cable, said first electrical link connecting the shield of the shielded cable to earth and comprising a protection resistor and a protection capacitor in parallel with the protection resistor.

According to one particular embodiment, the electrical protection system further comprises:

- at least one voltage detector, each voltage detector being associated with one first electrical link and being configured to measure the voltage across the terminals of the protection resistor of said first electrical link, and
- a fault monitor configured, for each voltage detector, to:
- receive a voltage measurement from the voltage detector, and
- transmit information representative of an insulation fault in the electrical apparatus associated with the first electrical link that is associated with the voltage detector when the voltage measurement exceeds a predefined voltage threshold.

According to one particular embodiment, the system further comprises a current detector configured to measure the current flowing through the second electrical link. The fault monitor is further configured to: receive the current measurement from the current detector; and transmit information representative of an insulation fault in the electrical circuit when the current measurement exceeds a predefined current threshold.

According to one particular embodiment, each protection resistor has a resistance of between 1 kΩ and 10 kΩ.

According to one particular embodiment, the generator generates a direct current and the plurality of apparatuses comprises at least one alternating current (AC) motor and an inverter located between the generator and said motor.

According to one particular embodiment, the generator is a set of fuel-cell stacks.

The invention also relates to an aircraft comprising such an electrical protection system.

The invention also relates to a method intended to detect an insulation fault in an electrical circuit, the electrical circuit comprising: a generator and a plurality of electrical apparatuses, each electrical apparatus comprising a chassis. The electrical circuit further comprises an electrical protection system comprising: a first electrical link associated with each electrical apparatus, each first electrical link connecting the chassis of said electrical apparatus to an earth and comprising a resistor, called the protection resistor; for at least one electrical apparatus operating under direct current, the associated first electrical link comprises a capacitor, called the protection capacitor, in parallel with the protection resistor; a second electrical link connecting a neutral point of the generator to earth; and at least one voltage detector, each voltage detector being associated with one first electrical link and being configured to measure the voltage across the terminals of the protection resistor of the first electrical link. The method is implemented by a fault monitor and comprises, for each voltage detector, steps of: receiving a voltage measurement from the voltage detector; and transmitting information representative of an insulation fault in the electrical apparatus associated with the first electrical link that is associated with the voltage detector when the measured voltage exceeds a predefined voltage threshold.

According to one particular embodiment, the electrical protection system further comprises a current detector configured to measure the current flowing through the second electrical link, and the method further comprises steps of: receiving the current measurement from the current detector; and transmitting information representative of an insulation fault in the electrical circuit when the measured current exceeds a predefined current threshold.

BRIEF DESCRIPTION OF THE DRAWINGS

The above-mentioned features of the invention, as well as others, will become more clearly apparent on reading the following description of at least one exemplary embodiment, said description being given with reference to the appended drawings, in which.

DETAILED DESCRIPTION OF EMBODIMENTS

Figure 1:
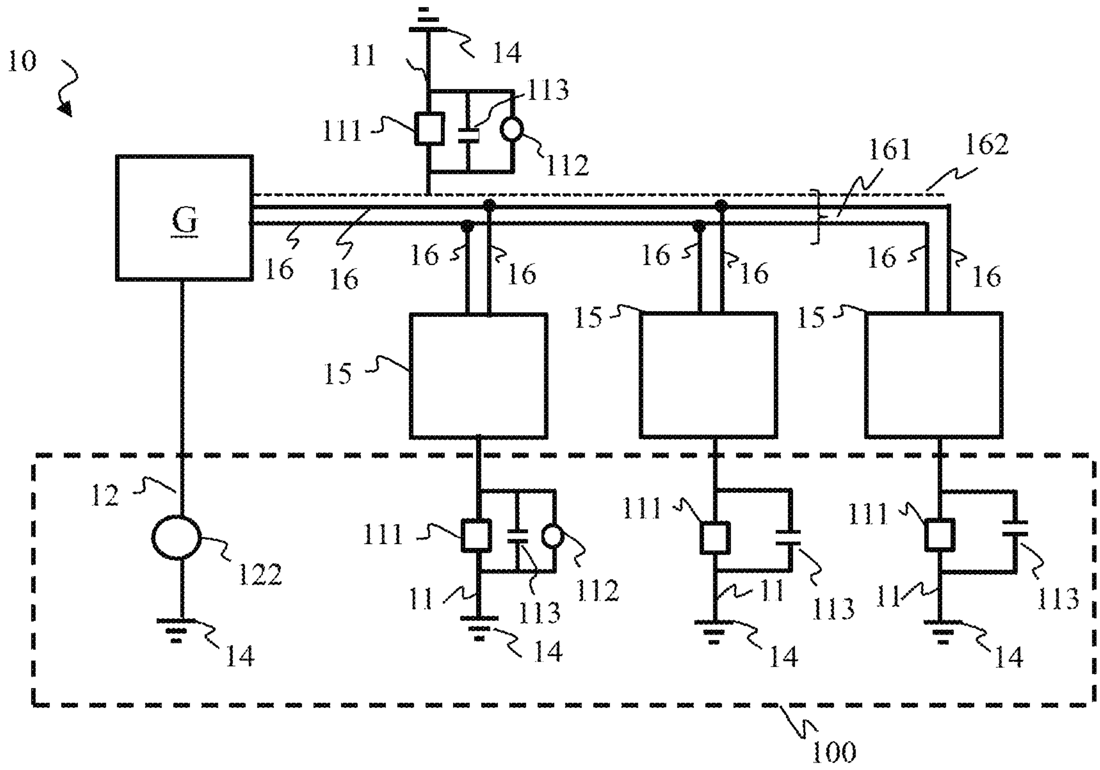
FIG. 1 schematically illustrates an electrical circuit comprising an electrical protection system according to a first embodiment.

Thus, FIG. 1 schematically illustrates an electrical circuit 10 comprising an electrical protection system 100, according to a first embodiment.

The electrical circuit 10 comprises a generator G configured to supply electrical power.

Figure 2A:
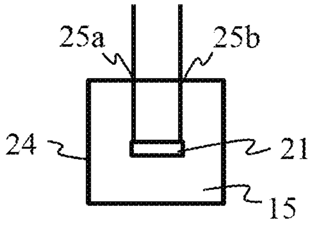
FIG. 2A schematically illustrates an electrical apparatus according to a first embodiment.
Figure 2B:
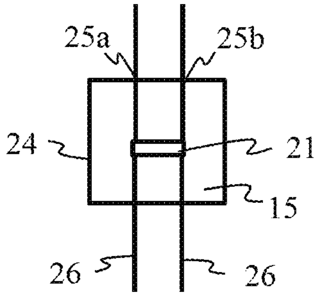
FIG. 2B schematically illustrates an electrical apparatus according to a second embodiment.
Figure 2C:
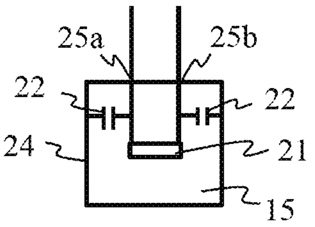
FIG. 2C schematically illustrates an electrical apparatus according to a third embodiment.

The electrical circuit 10 further comprises a plurality of electrical apparatuses 15. FIGS. 2A, 2B and 2C illustrate, schematically and in more detail, one electrical apparatus 15 of said plurality of electrical apparatuses 15. The electrical apparatus 15 comprises an electrical load 21 and a chassis 24. The chassis 24 of the electrical apparatus 15 is a conductive part of the electrical apparatus 15 that is not normally live, in other words it is not intentionally connected, by an electrical link, to a non-zero potential. The chassis 24 of the electrical apparatus 15 is, for example, an outer metal case of the electrical apparatus 15. The electrical load 21 is an electrical component, such as a two-terminal or three-terminal component, or a plurality of electrical components that are connected to one another, and that allow an electrical function to be performed. Alternatively, the electrical load 21 is a converter, as illustrated in FIG. 2B, or a motor, for example a three-phase, six-phase or twelve-phase motor.

According to a first embodiment illustrated in FIG. 2A, the electrical apparatus 15 comprises a positive pole 25*a* and a negative pole 25*b*, to which the electrical load 21 is connected. Alternatively, the electrical apparatus 15 has three inputs connected to the electrical load 21, for example when the electrical load 21 is a three-terminal component such as a transistor. The electrical apparatus 15 also has three inputs when it is a three-phase motor.

According to a second embodiment illustrated in FIG. 2B, the electrical apparatus 15 is a converter, such as a DC-DC converter, capable of modifying a voltage, an inverter, capable of delivering an AC voltage and current from a DC power source, a transformer or a rectifier. The converter is then connected, on the one hand, to the generator G by means of the poles 25*a* and 25*b* and, on the other hand, to at least one electrical apparatus 15 by means of outputs 26. The outputs 26 are two in number. Alternatively, the outputs 26 are three or more in number when the converter is dedicated to supplying power to an electrical apparatus 15 that has a number of phases greater than or equal to three, such as a three-phase, six-phase or twelve-phase motor.

According to a third embodiment illustrated in FIG. 2C, the electrical apparatus 15 further comprises filtering capacitors 22 that are each located on one electrical link connecting one of the poles 25*a*, 25*b* to the chassis 24. The filtering capacitors 22 allow unwanted alternating current components to be filtered by transmitting them to the chassis 24, thus preventing said alternating current components from damaging or deteriorating the performance of the electrical load 21. The filtering capacitors 22 are shown in an electrical apparatus 15 such as illustrated in FIG. 2A, but may also be present in an electrical apparatus 15 of converter type such as shown in FIG. 2B.

Referring again to FIG. 1, the chassis 24 of separate electrical apparatuses 15 are not connected to one another.

The electrical circuit 10 further comprises electrical links schematically shown in the figures by solid lines. The electrical circuit 10 thus comprises electrical links called supply links 16 that allow the generator G to be electrically connected to each electrical apparatus 15. The supply links 16 make it possible to make current flow from a first terminal of the generator G to a second terminal of the generator G through each electrical apparatus 15. An electrical apparatus 15 is connected to the terminals of the generator G either directly, in other words solely by means of supply links 16, or by means of at least one other electrical apparatus 15 acting as a converter. The electrical connections between two supply links 16 are schematically shown in the figures by dots.

A supply link 16 may be physically embodied by a cable such as a shielded cable 161, comprising two supply links 16 allowing current to be made to flow in two opposite directions and comprising a shield 162, which has been represented in the figures by a broken line. In one particular embodiment, the electrical circuit 10 thus comprises at least one shielded cable 161.

The electrical protection system 100 of the electrical circuit 10 is intended to protect the electrical circuit 10 when an insulation fault occurs, or in other words when an electrical link, electrically connected to one of the terminals of the generator G, makes contact with the chassis 24 of an electrical apparatus 15.

The electrical protection system 100 comprises, for each electrical apparatus 15, one first electrical link 11 connecting the chassis 24 of said electrical apparatus 15 to earth 14, earth 14 being a reference potential of the electrical circuit 10. Furthermore, the electrical protection system 100 comprises a resistor, called the protection resistor 111, that is located on each first electrical link 11, between the chassis 24 of the electrical apparatus 15 and earth 14.

According to one embodiment, the resistance of the protection resistor 111 is set depending on a number of electrical apparatuses 15 in the electrical circuit 10 and/or depending on a number of insulation faults that the protective system 100 must tolerate. The higher the resistance of the protection resistor 111, the higher the number of insulation faults that may be tolerated.

According to another embodiment, the resistance of the protection resistor 111 is set depending on the maximum value of fault current that is permitted (in particular to limit heating in the cables (links 16) supplying the electrical load 21). For example, for a network (electrical circuit) the supply voltage of which is about 800 V to 1000 V, the protection resistor 111 may be chosen to have a resistance equal to about 1 kΩ to limit a fault current to 1 A. A resistance of 10 kΩ allows the current to be limited to 0.1 A. A resistance chosen in the interval 1 kΩ to 10 kΩ may thus be suitable in many situations.

The resistance of the protection resistor 111 may be the same for each first electrical link 11 or may differ depending on the first electrical link 11 in question. For example, the more fragile an electrical apparatus 15, the higher the resistance of the protection resistor 111 of a first electrical link 11 associated with the electrical apparatus 15 in question. According to another example, the resistance of the protection resistor 111 is higher for low-power loads that require a lower supply current. The protection resistor 111 is for example dimensioned so as to keep the ratio between the rated current of the load and the fault current in a determined interval that ensures acceptable cable heating in the event of a fault.

Thus, each protection resistor 111 allows at least one insulation fault to be successfully tolerated by limiting the current flowing to earth 14, said current being inversely proportional to the resistance of the protection resistor 111.

For at least one (and preferably each) electrical apparatus 15 operating under direct current, the associated first electrical link 11 further comprises a capacitor, called the protection capacitor 113, in parallel with the protection resistor 111. Thus, in the example of FIG. 1, it is assumed that all the electrical apparatuses 15 operate under direct current, and for each thereof the associated first electrical link 11 comprises a protection capacitor 113 in parallel with the protection resistor 111.

The protection capacitor 113 is for example dimensioned to hold the voltage of the network (electrical circuit 10), which is for example 800 V. In general, harmonic currents are relatively low and therefore the corresponding power is also low. The power that the protection capacitor 113 allows to be dissipated is determined depending on the expected harmonic currents.

Thus, for an electrical apparatus operating under direct current, the associated first electrical link (which connects the chassis of this electrical apparatus to earth) comprises a protection resistor 111 and a protection capacitor 113 in parallel. As already mentioned above, in the event of an insulation fault, the protection resistor 111 passes to earth the direct component of the fault current, and the protection capacitor 113 lets pass to earth the one or more alternating components of the current ("harmonic currents").

As illustrated in FIG. 1, when the electrical circuit 10 comprises at least one shielded cable 161, the electrical protection system 100 further comprises one first electrical link 11 for each shielded cable 161. The first electrical link 11 in question thus connects the shield 162 of the shielded cable 161 to earth 14 and comprises the protection resistor 111 and the protection capacitor 113 connected in parallel.

The electrical protection system 100 further comprises a second electrical link 12 immediately connecting a neutral point (i.e., a 0 V reference voltage) of the generator G to earth 14. In other words, the second electrical link 12 does not comprise an intentionally added impedance. Thus, the second electrical link 12 comprises only an unavoidable impedance, made up of the impedance of an electrical wire providing said second electrical link 12, of a contact between said electrical wire and earth 14 and of a contact between said electrical wire and the neutral point of the generator.

Thus, the electrical protection system 100 is able to tolerate a plurality of insulation faults each occurring in one separate electrical apparatus 15 (or shielded cable 161) of the electrical circuit 10, since the path passing through two insulation faults then comprises two protection resistors 111, each associated with the electrical apparatus 15 in which each of the insulation faults is located, and is thus higher impedance than the path passing through the neutral point of the generator G, which comprises a single protection resistor 111, for each insulation fault.

The electrical protection system 100 further comprises at least one voltage detector 112 such as a voltmeter. Each voltage detector 112 is associated with an electrical apparatus 15 of the plurality of electrical apparatuses 15 or with a shielded cable 161. The voltage detector 112 is configured to measure the voltage across the terminals of the protection resistor 111 of the first electrical link 11 associated with the electrical apparatus 15 in question or with the shielded cable 161 in question.

The electrical protection system 100 further comprises a fault monitor 600 (shown in FIG. 6), configured to communicate with each voltage detector 112 and to compare the measured voltage with a predefined voltage threshold. According to one example, the predefined voltage threshold is equal to the resistance of the protection resistor 111 multiplied by a predefined current threshold, the predefined current threshold being described below.

When the measured voltage exceeds the predefined voltage threshold, the fault monitor 600 then determines that an insulation fault is present in the electrical circuit 10, on the electrical apparatus 15 or shielded cable 161 associated with the voltage detector 112. Specifically, as long as there is no insulation fault on the electrical apparatus 15 or shielded cable 161, the current flowing between the chassis 24 of the electrical apparatus 15 or the shield 162 and earth 14 is low and the voltage across the terminals of the protection resistor 111 is therefore low. In contrast, when an insulation fault occurs, the protection resistor 111 is connected between one of the terminals of the generator G and earth 14, causing an increase in the potential difference across the terminals of said protection resistor 111. By insulation fault on an electrical apparatus 15, what is meant here is an insulation fault occurring in or around the electrical apparatus 15, or in other words when the chassis 24 of said electrical apparatus 15 makes contact with an electrical link connected to the generator G, irrespectively of whether said electrical link is located outside or inside the electrical apparatus 15. An insulation fault on a shielded cable 161 is similarly defined.

Advantageously, the electrical protection system 100 comprises a current detector 122, such as an ammeter, located on the second electrical link 12 and configured to detect the current flowing through the second electrical link 12. The fault monitor 600 is then configured to communicate with the current detector 122 and to compare the measured current with a predefined current threshold. According to one example, the predefined current threshold is equal to 0.01 A. According to another example, the predefined current threshold is equal to 0.001 A.

When the measured current exceeds the predefined current threshold, the fault monitor 600 then determines that an insulation fault is present in the electrical circuit 10. Specifically, provided that there is no insulation fault in the circuit 10, the current flowing through the second electrical link 12 remains low. In contrast, when an insulation fault occurs in the electrical circuit 10, the current flowing through the second electrical link 12 is higher since it increases due to an increase in the potential difference between earth 14 and the neutral point of the generator G.

Thus, it is possible with the fault monitor 600 to easily locate an insulation fault in the electrical circuit 10, this facilitating management of maintenance.

Figure 3:
FIG. 3 schematically illustrates an aircraft that comprises at least one electrical circuit comprising the electrical protection system.

FIG. 3 schematically illustrates an aircraft 3 that comprises at least one electrical circuit 10 comprising the electrical protection system 100. It will be noted that, for any electrical circuit 10 of the aircraft 3, the earth 14 does not correspond to earth as conventionally defined by the conductive mass of Earth, but corresponds to a predefined reference potential, said potential being assumed to be zero under ideal operating conditions. In the aircraft 3, the earth 14 such as defined in the invention is for example a hull of the aircraft 3.

According to one exemplary embodiment, the aircraft 3 comprises pods 31 and each pod 31 comprises at least one electrical circuit 10 comprising the electrical protection system 100. According to this example, the earth 14 is a casing of the pod 31.

Figure 4:
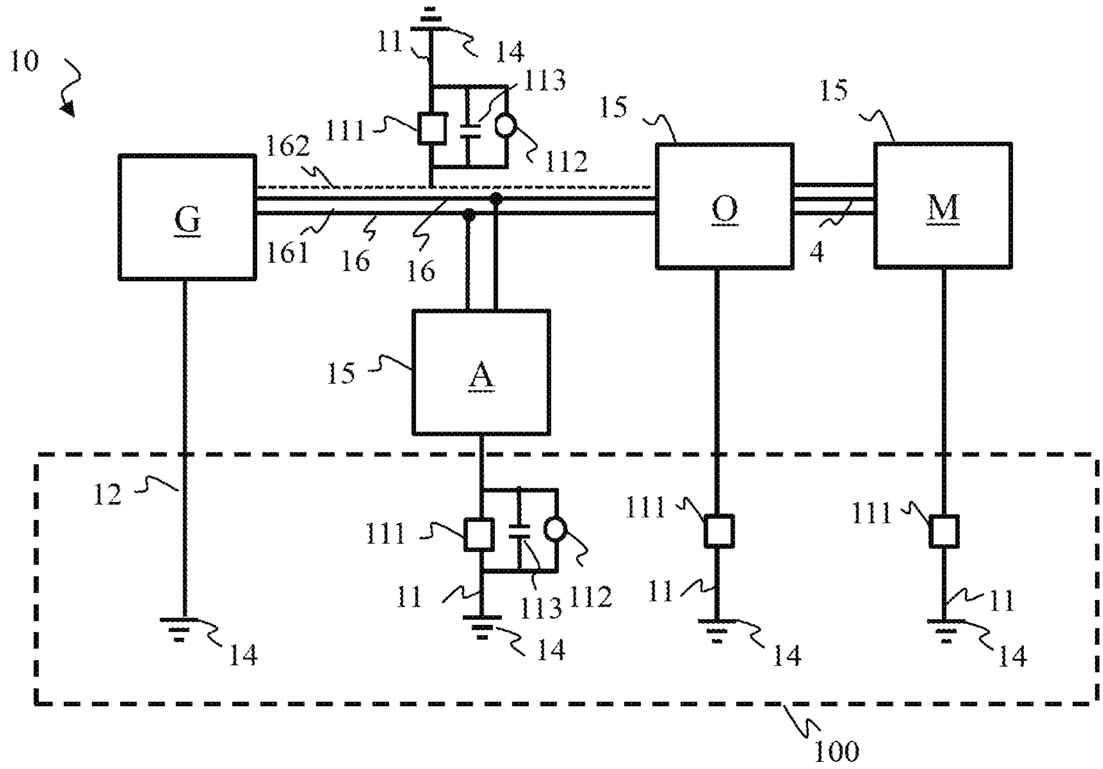
FIG. 4 schematically illustrates the electrical circuit comprising the electrical protection system, according to a second embodiment.

FIG. 4 schematically illustrates the electrical circuit 10 comprising the electrical protection system 100, according to a second embodiment.

According to said second embodiment, the generator G is a power source configured to generate a direct current across its terminals. Preferably, the generator G is a set of fuel-cell stacks.

The plurality of electrical apparatuses 15 of the electrical circuit 10 comprises an apparatus A operating under direct current and directly connected to the terminals of the generator G by supply links 16. The first electrical link associated with apparatus A (which connects the chassis of this apparatus A to earth) comprises a protection resistor 111 and a protection capacitor 113 in parallel.

Furthermore, the plurality of electrical apparatuses 15 of the electrical circuit 10 comprises at least one AC motor M and comprises an inverter O located between the generator G and said motor M. According to one exemplary embodiment, the motor M is powered by three AC phases 4 output by the inverter O.

In one particular embodiment, because the motor M is an electrical apparatus 15 operating under alternating current, the first electrical link 11 associated with the motor M (which connects the chassis of this motor to earth) comprises only a protection resistor 111, and no protection capacitor in parallel.

When an insulation fault occurs between an electrical link carrying an alternating signal (for example one of the phases 4 of the motor M) and the chassis 24 of a first electrical apparatus 15 (for example the chassis of the motor M), an alternating voltage develops between said chassis 24 and earth 14. The protection resistor 111 associated with said first electrical apparatus 15 (motor M in the aforementioned example) then allows the current flowing to earth 14 to be limited, the current flowing to earth 14 being inversely proportional the resistance of the protection resistor 111.

For example, when the terminals of the generator G have respective potentials of 400 V and −400 V, and when the AC supply voltage of the motor M is 270 V (peak value), the resistance of the protection resistor 111 is 10 kΩ. In the event of an insulation fault on the motor M, between a phase 4 and the chassis 24 of the motor M, the alternating fault current flowing to earth 14 is 0.028 A (peak value). In the event of an insulation fault on apparatus A, the direct fault current flowing to earth 14 is 0.04 A.

A filtering capacitor 22 located in a second electrical apparatus 15 of the electrical circuit 10 (for example apparatus A implemented in the form of the third embodiment of FIG. 2C) thus sees a low enough voltage across its terminals to not be damaged by the presence of the insulation fault on the second electrical apparatus 15 (apparatus A for example).

Figure 5:
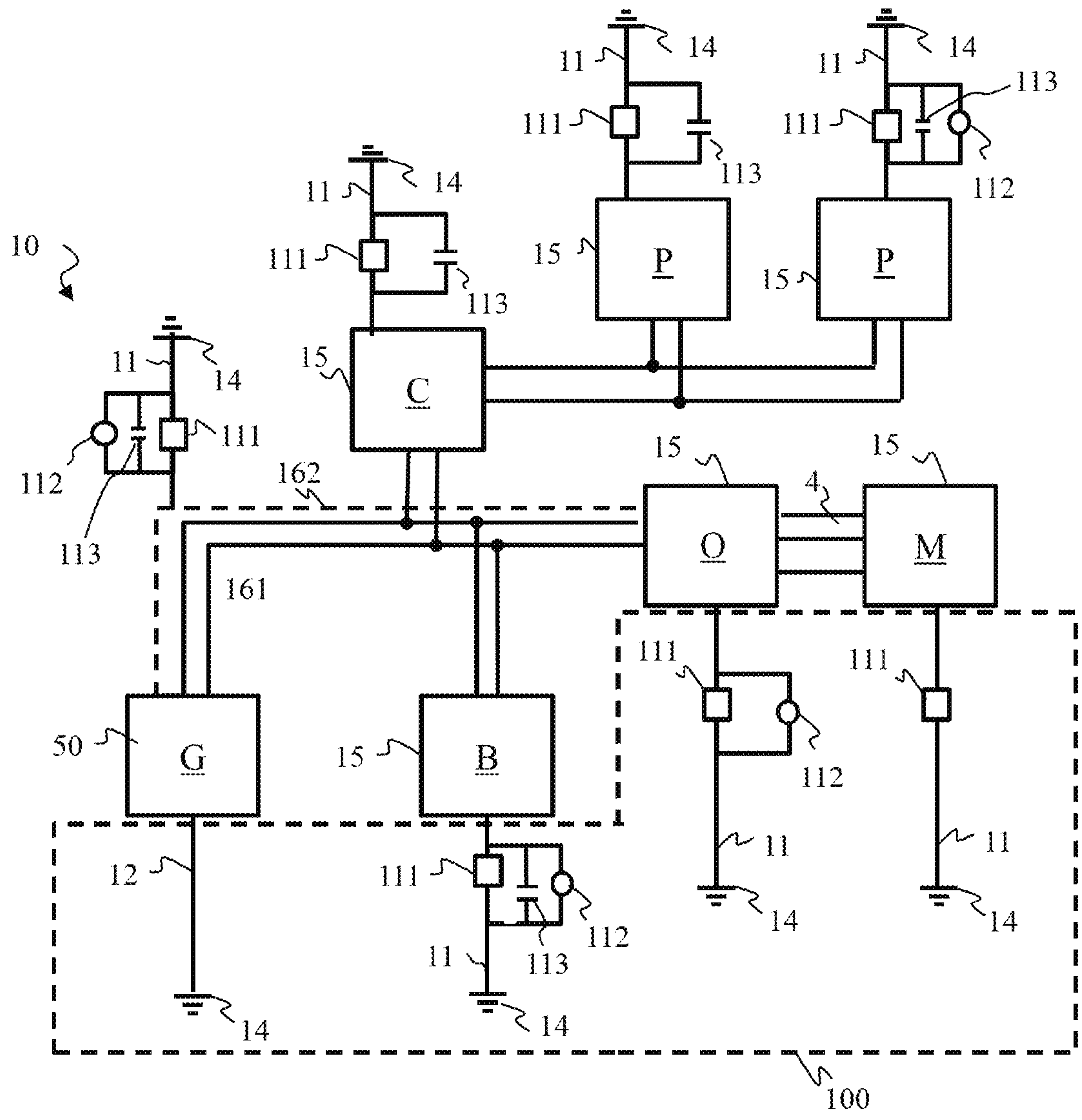
FIG. 5 schematically illustrates the electrical circuit comprising the electrical protection system, according to a third embodiment.

FIG. 5 schematically illustrates the electrical circuit 10 comprising the electrical protection system 100, according to a third embodiment.

According to said third embodiment, the generator G is a set of fuel-cell stacks capable of supplying a direct current. The plurality of electrical apparatuses 15 comprises the motor M, and the inverter O located between the motor M and the generator G.

In one particular embodiment, because the motor M is an electrical apparatus 15 operating under alternating current, the first electrical link 11 associated with the motor M (which connects the chassis of this motor to earth) comprises only a protection resistor 111, and no protection capacitor in parallel.

The plurality of electrical apparatuses 15 further comprises a DC-DC converter C connecting the generator G to pumps P of the plurality of electrical apparatuses 15. The pumps P are for example used to make fluids, such as heat transfer fluids, flow in order to thermally regulate equipment, or to deliver fluids such as dihydrogen or dioxygen consumed by the fuel-cells stacks of the generator G to generate electrical power.

In one particular embodiment, because the converter C is an electrical apparatus 15 operating under direct current, the first electrical link 11 associated with the converter C (which connects the chassis of this converter C to earth) comprises a protection resistor 111 and a protection capacitor 113 in parallel.

Furthermore, because each of the pumps P is an electrical apparatus 15 operating under direct current, the first electrical link 11 associated with each pump P (which connects the chassis of this pump P to earth) comprises a protection resistor 111 and a protection capacitor 113 in parallel.

Furthermore, the plurality of electrical apparatuses 15 comprises an electrical buffer B comprising a capacitor or a set of capacitors capable of storing a predefined amount of energy. When the motor M requires an increase in power in a short space of time, one that is too short given the reaction speed of the generator G, during take-off for example, the electrical buffer B is thus able to deliver, in the short space of time, said stored predefined amount of energy, in order to compensate for the reaction speed of the generator G.

In one particular embodiment, because the electrical buffer B is an electrical apparatus 15 operating under direct current, the first electrical link 11 associated with the electrical buffer B (which connects the chassis of this electrical buffer B to earth) comprises a protection resistor 111 and a protection capacitor 113 in parallel.

Figure 6:
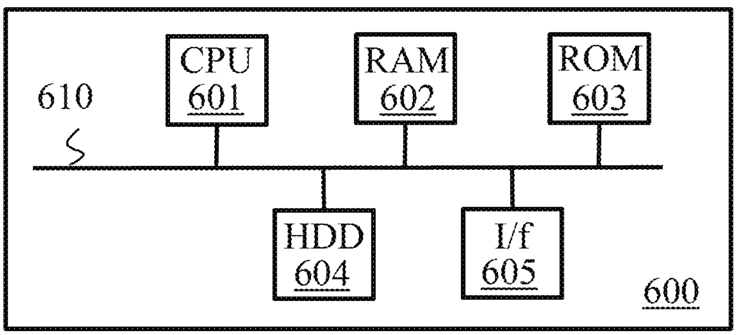
FIG. 6 schematically illustrates one example of a hardware platform allowing a fault monitor to be implemented in the form of electronic circuitry.

FIG. 6 schematically illustrates one example of a hardware platform allowing the fault monitor 600 to be implemented in the form of electronic circuitry.

The hardware platform comprises the following, connected by a communication bus 710: a processor or central processing unit CPU 601; a random-access memory RAM 602; a read-only memory ROM 603, for example an electrically erasable programmable read-only memory (EEPROM) such as a flash memory, or another type of read-only memory; a storage unit HDD 604, such as a hard disk drive or a storage medium reader such as an SD card reader (SD standing for Secure Digital); and an interface manager I/f 605.

The interface manager I/f 605 allows the fault monitor to interact with the current detector 122 of the electrical protection system 100 and with each voltage detector 112 associated with an electrical device 15 or a shielded cable 161. The interface manager I/f 605 further allows the fault monitor to interact with a display and/or a maintenance management device of the aircraft 3.

The processor 601 is capable of executing instructions loaded into the random access memory 402 from the read-only memory 603, from an external memory, from a storage medium (such as an SD card), or from a communication network. When the hardware platform is powered up, the processor 601 is capable of reading instructions from the random-access memory 602 and of executing them. These instructions form a computer program that causes the processor 601 to implement all or some of the steps and methods described here with reference to the fault monitor.

All or some of the steps, methods and operations described here with reference to the fault monitor may thus be implemented in software form by executing a set of instructions by means of a programmable machine, for example a digital signal processor (DSP) or a microcontroller, or be implemented in hardware form by a machine or a dedicated chip or a dedicated chipset, for example an field-programmable gate array (FPGA) or application-specific integrated circuit (ASIC). Generally, the fault monitor comprises electronic circuitry designed and configured to implement the methods and steps described here.

Figure 7:
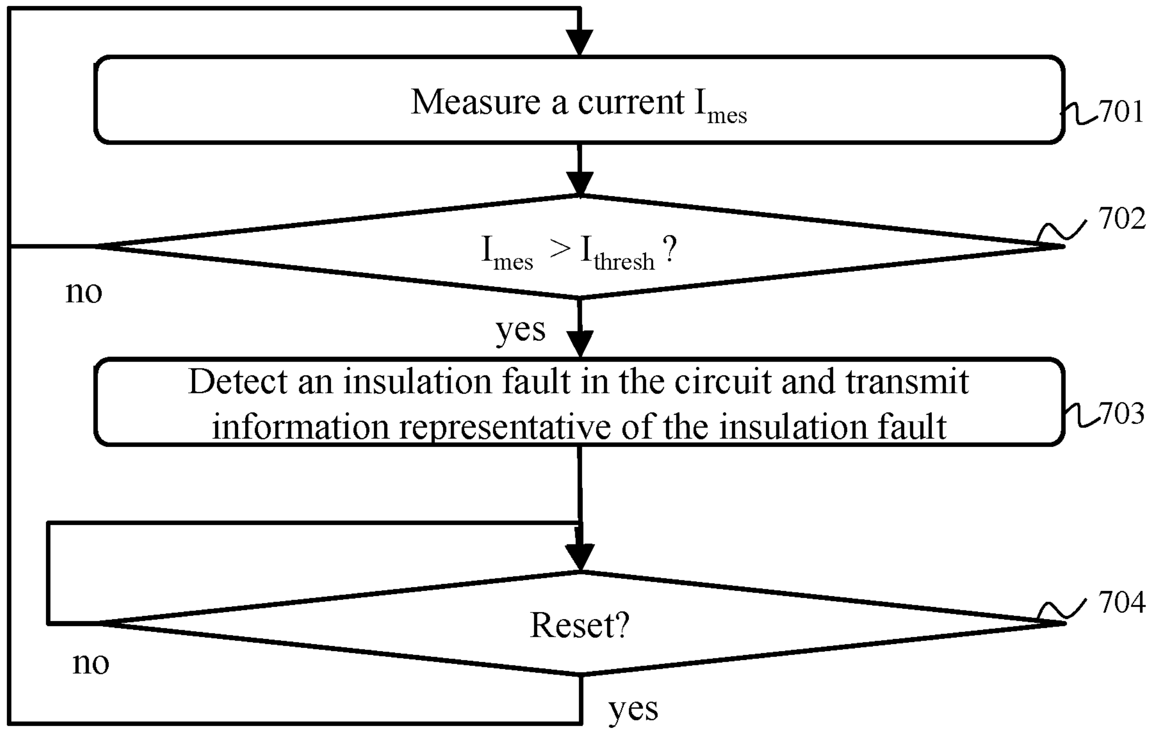
FIG. 7 schematically illustrates a method for detecting an insulation fault, according to a first embodiment, implemented by the fault monitor.

FIG. 7 schematically illustrates a method, according to a first embodiment, for detecting an insulation fault in the electrical circuit 10. The method is implemented by the fault monitor 600 of the electrical protection system 100.

In a step 701, the fault monitor 600 retrieves a measurement of a current flowing through the second electrical link 12, from the current detector 122. According to one example, the current detector 122 is able to measure periodically the current flowing through the second electrical link 12 and to send each measurement to the fault monitor 600 as soon as the measurement is carried out. Alternatively, the fault monitor 600 transmits a measurement order to the current detector 122, which transmits the current measurement in response.

In a following step 702, the fault monitor 600 compares the received current measurement with the predefined current threshold. Provided that the current measurement remains less than or equal to the predefined current threshold, the fault monitor 600 returns to step 701, optionally after a predefined delay has elapsed. If the current measurement exceeds the predefined current threshold, the fault monitor 600 passes to a step 703.

In step 703, the fault monitor 600 determines that an insulation fault is present in the electrical circuit 10.

The fault monitor 600 transmits information representative of the presence of an insulation fault in the electrical circuit 10, to the display, which is for example visible to a pilot of the aircraft 3, and/or to the maintenance management device of the aircraft 3. The pilot is thus informed that an insulation fault has occurred and may decide whether or not to stop the generator G. The maintenance management device of the aircraft 3 is thus able to trigger or schedule an operation of maintenance of the electrical circuit 10.

In a following step 704, the fault monitor 600 determines whether a reset has occurred. A reset is for example achieved by pressing a dedicated button when maintenance in respect of an insulation fault has occurred. If this is the case, the fault monitor 600 transmits information representative of the absence of an insulation fault on the electrical apparatus 15 or shielded cable 161 in question and then returns to step 701. Otherwise, the fault monitor 600 remains at step 704.

Figure 8:
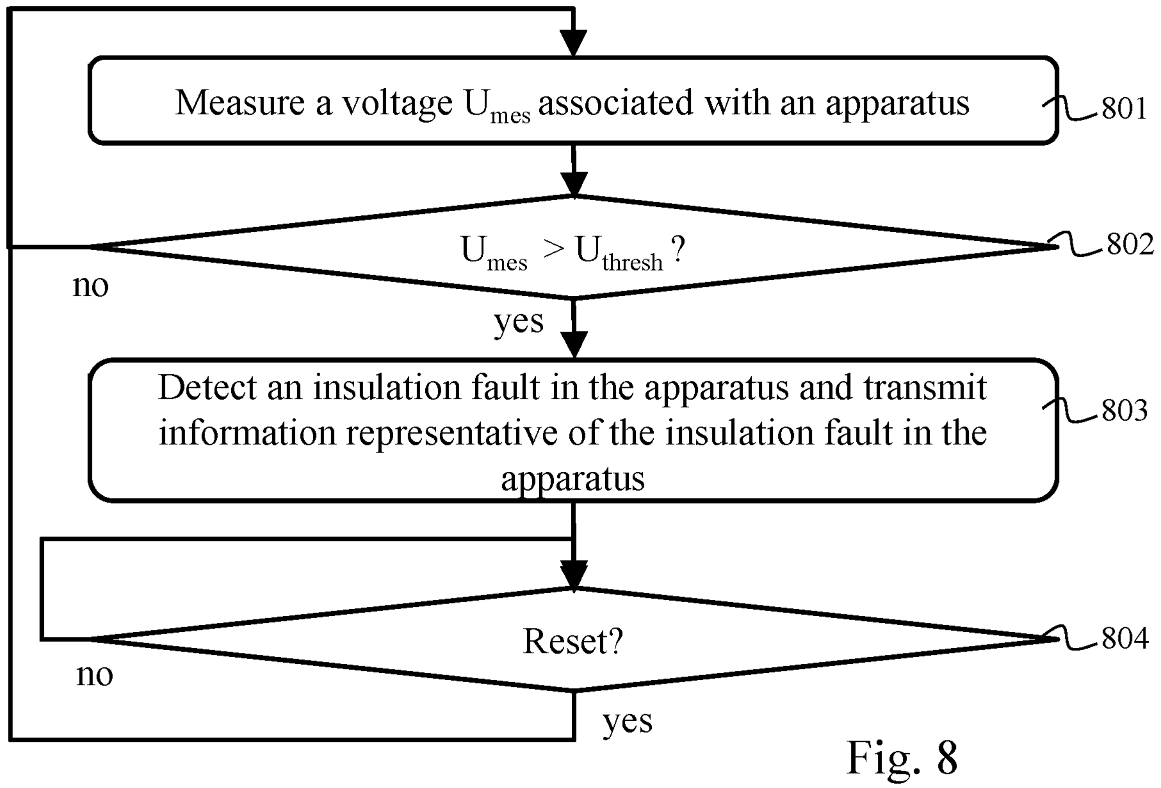
FIG. 8 schematically illustrates a method for detecting an insulation fault, according to a second embodiment, implemented by the fault monitor.

FIG. 8 schematically illustrates a method, according to a second embodiment, for detecting an insulation fault in the electrical circuit 10. The method is implemented by the fault monitor 600 of the electrical protection system 100.

In a step 801, the fault monitor 600 retrieves a measurement of a voltage across the terminals of a protection resistor 111 from the voltage detector 112 associated with an electrical apparatus 15 or with a shielded cable 161. According to one example, the voltage detector 112 is able to measure said voltage periodically and to send each measurement to the fault monitor 600 as soon as the measurement is carried out. Alternatively, the fault monitor 600 transmits a measurement order to the voltage detector 112, which transmits the voltage measurement in response. According to one particular embodiment, the voltage measurement is received in association with an identifier of the electrical apparatus 15 or of the shielded cable 161 associated with the voltage detector 112.

In a following step 802, the fault monitor 600 compares the received voltage measurement with the predefined voltage threshold. Provided that the voltage measurement remains less than or equal to the predefined voltage threshold, the fault monitor 600 returns to step 801, optionally after a predefined delay has elapsed. If the voltage measurement exceeds the predefined voltage threshold, the fault monitor 600 passes to a step 803.

In step 803, the fault monitor 600 determines that an insulation fault is present in the electrical circuit 10, on the electrical apparatus 15 or shielded cable 161 associated with the voltage detector 112 in question.

The fault monitor 600 then transmits information representative of the presence of an insulation fault on the electrical apparatus 15 or shielded cable 161 in question, to the display, which is for example visible to a pilot of the aircraft 3, and/or to the maintenance management device of the aircraft 3. Thus, the pilot is informed that an insulation fault has occurred and may decide whether or not to stop the generator G given the location of said insulation fault. The maintenance management device of the aircraft 3 may thus trigger or schedule a maintenance operation aimed at replacing the electrical apparatus 15 or the shielded cable 161 in question.

In a following step 804, the fault monitor 600 determines whether a reset has occurred. A reset is for example achieved by pressing a dedicated button when maintenance has occurred in respect of the detected insulation fault on the electrical apparatus 15 or shielded cable 161 in question. If this is the case, the fault monitor 600 transmits information representative of the absence of an insulation fault on the electrical apparatus 15 or shielded cable 161 in question and then returns to step 801. Otherwise, the fault monitor 600 remains at step 804.

The method for detecting insulation faults according to the first embodiment and the method for detecting insulation faults according to the second embodiment may be implemented by the fault monitor 600 independently of each other, selectively or in parallel.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. An electrical protection system for protecting an electrical circuit of an aircraft, the electrical circuit comprising:

a generator, a plurality of electrical apparatuses, each electrical apparatus comprising a chassis, a first electrical link associated with each electrical apparatus, each first electrical link connecting the chassis of said electrical apparatus an earth, each first electrical link comprising a resistor, called the protection resistor, wherein the protection resistor is arranged such that in case of an insulation fault of said electrical apparatus. said protection resistor passes directly to earth the direct component of the fault current, and a second electrical link connecting a neutral point of the generator to the earth, wherein for at least one electrical apparatus, from the plurality of electrical apparatuses, operating under direct current, the associated first electrical link comprises a capacitor, called the protection capacitor, in parallel with the protection resistor, wherein the protection capacitor is arranged such that said protection capacitor passes directly to the earth one or more alternating components of the supply current of said electrical apparatus.

2. The electrical protection system according to claim 1, wherein, for at least one electrical apparatus, from the plurality of electrical apparatuses, operating under alternating current, the associated first electrical link comprises only the protection resistor, and no protection capacitor in parallel.

3. The electrical protection system according to claim 1, further comprising:

at least one shielded cable comprising a shield and connecting at least one electrical apparatus, from the plurality of electrical apparatuses, to terminals of the generator, and a first electrical link associated with each shielded cable, said first electrical link connecting the shield of the shielded cable to the earth and comprising a protection resistor and a protection capacitor in parallel with the protection resistor.

4. The electrical protection system according to claim 1, further comprising:

at least one voltage detector, each voltage detector being associated with one first electrical link and being configured to measure a voltage across terminals of the protection resistor of said first electrical link, and a fault monitor configured, for each voltage detector, to:

receive a voltage measurement from the voltage detector, and transmit information representative of an insulation fault in the electrical apparatus associated with the first electrical link that is associated with the voltage detector when the voltage measurement exceeds a predefined voltage threshold.

5. The electrical protection system according to claim 4, further comprising:

a current detector configured to measure a current flowing through the second electrical link, wherein the fault monitor is further configured to:

receive a current measurement from the current detector, and transmit information representative of an insulation fault in the electrical circuit when the current measurement exceeds a predefined current threshold.

6. The electrical protection system according to claim 1, wherein each protection resistor has a resistance of between 1 kΩ and 10 kΩ.

7. The electrical protection system according to claim 1, wherein the generator generates a direct current, and wherein the plurality of electrical apparatuses comprises at least one alternating current motor and an inverter located between the generator and said motor.

8. The electrical protection system according to claim 1, wherein the generator is a set of fuel-cell stacks.

9. An aircraft comprising:

the electrical protection system according to claim 1.

10. The electrical protection system according to claim 1, wherein the protection resistor is sized so as to keep a ratio between a rated current of the electrical apparatus and the fault current within a predetermined interval acceptable for heating the supply cables of the electrical apparatus in the event of a fault.

11. A method to detect an insulation fault in an electrical circuit, the electrical circuit comprising a generator, a plurality of electrical apparatuses, each electrical apparatus comprising a chassis, and an electrical protection system having: a first electrical link associated with each electrical apparatus, each first electrical link connecting the chassis of said electrical apparatus to an earth, each first electrical link comprising a resistor, called the protection resistor, wherein the protection resistor is arranged such that in case of an insulation fault of said electrical apparatus, said protection resistor passes directly to earth the direct component of the fault current;

for at least one electrical apparatus operating under direct current, the associated first electrical link comprises a capacitor, called the protection capacitor, in parallel with the protection resistor, wherein the protection capacitor is arranged such that said protection capacitor passes directly to the earth one or more alternating components of the supply current of said electrical apparatus; a second electrical link immediately connecting a neutral point of the generator to the earth; and at least one voltage detector, each voltage detector being associated with a first electrical link and being configured to measure a voltage across terminals of the protection resistor of the first electrical link, wherein the method is implemented by a fault monitor and comprises, for each voltage detector, the steps of:

receiving a voltage measurement from the voltage detector, and transmitting information representative of an insulation fault in the electrical apparatus associated with the first electrical link that is associated with the voltage detector when the voltage measurement exceeds a predefined voltage threshold.

12. The method according to claim 11, wherein the electrical protection system further comprises a current detector configured to measure a current flowing through the second electrical link, and where the method further comprises the steps of:

receiving a current measurement from the current detector, and transmitting information representative of an insulation fault in the electrical circuit when the current measurement exceeds a predefined current threshold.

13. The method according to claim 11, wherein the protection resistor is sized so as to keep a ratio between a rated current of the electrical apparatus and the fault current within a predetermined interval acceptable for heating the supply cables of the electrical apparatus in the event of a fault.

* * * * *